(12) United States Patent
Aizawa

(10) Patent No.: US 9,331,660 B2
(45) Date of Patent: May 3, 2016

(54) NOISE FILTER DEVICE

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventor: Takeshi Aizawa, Yokkaichi (JP)

(73) Assignees: AUTONETWORKS TECHNOLOGIES, LTD. (JP); SUMITOMO WIRING SYSTEMS, LTD. (JP); SUMITOMO ELECTRIC INDUSTRIES, LTD. (JP)

( * ) Notice: Subject to any disclaimer, the term of this patent is extended or adjusted under 35 U.S.C. 154(b) by 3 days.

(21) Appl. No.: 14/450,907

(22) Filed: Aug. 4, 2014

(65) Prior Publication Data

US 2015/0042416 A1    Feb. 12, 2015

(30) Foreign Application Priority Data

Aug. 7, 2013    (JP) .................................. 2013-163709

(51) Int. Cl.
*H03H 7/01* (2006.01)
*H03H 1/00* (2006.01)

(52) U.S. Cl.
CPC ........... *H03H 7/0115* (2013.01); *H03H 1/0007* (2013.01); *H03H 7/0138* (2013.01)

(58) Field of Classification Search
CPC .. H03H 7/0115; H03H 7/0138; H03H 1/0007
USPC .................................................. 333/185, 181
See application file for complete search history.

(56) References Cited

U.S. PATENT DOCUMENTS

| | | | |
|---|---|---|---|
| 2009/0115551 A1 | 5/2009 | Kobayashi et al. | |
| 2011/0074524 A1* | 3/2011 | Nishioka ............. | H03H 7/0115 333/175 |

* cited by examiner

*Primary Examiner* — Benny Lee
*Assistant Examiner* — Rakesh Patel
(74) *Attorney, Agent, or Firm* — Gerald E. Hespos; Michael J. Porco; Matthew T. Hespos

(57) ABSTRACT

A noise filter device has a coil formed by winding a conductive wire on a magnetic core. The noise filter device further has a bracket formed of a magnetic material and grounded. The bracket has a bottom plate and two end plates that project from the bottom plate. The end plates face opposite end surfaces of the magnetic core with predetermined gaps defined between the end plates and the end surfaces. The noise filter device further has capacitors that form part of a noise filter circuit together with the coil and that are connected to the bracket. A housing houses the coil, the capacitors and the bracket in an at least partly exposed state, and input and output terminals are provided for the noise filter circuit.

8 Claims, 6 Drawing Sheets

NOISE FILTER DEVICE

BACKGROUND OF THE INVENTION

1. Field of the Invention

The invention relates to a noise filter device.

2. Description of the Related Art

A known vehicle-mounted noise filter device includes a filter circuit using a coil and a capacitor that are mounted in a housing. However, magnetic fluxes generated by a current flowing in the coil may adversely affect other elements and deteriorate filter characteristics. US2009/115551 discloses a noise filter device with a bracket made of a magnetic material. The bracket has two end plates facing opposite end surfaces of a magnetic core of the coil in an axial direction and a bottom plate is provided in a bottom part of the housing and couples the end plates. With this configuration, magnetic fluxes generated by the flow of a current in the coil are concentrated on a loop magnetic path (closed magnetic path) formed by the magnetic core and the bracket. Thus, magnetic fluxes do not affect other elements.

However, the bracket must be exposed from the bottom surface of the housing when performing wiring to the bracket, thereby complicating a device configuration.

The invention was completed based on the above situation and aims to allow for a noise filter device with a simple device configuration and/or in which a wiring operation to a bracket is facilitated.

SUMMARY OF THE INVENTION

The invention relates to a noise filter device that has an inductance and a bracket with two end plates and a base plate coupling the end plates. The end plates face opposite end surfaces of the inductance in an axial direction. The bracket is arranged with specified gaps defined between the end plates and the end surfaces of the inductance. The bracket is formed of a magnetic material and is grounded. The noise filter device also has at least one capacitor connected to the bracket and forming part of a noise filter circuit together with the inductance. A housing also is provided for housing the inductance, the capacitor and the bracket inside in an at least partly exposed state. The noise filter device further has input and/or output terminals for the noise filter circuit.

The inductance preferably comprises a coil formed by winding a conductive wire on a magnetic core. The end plates of the bracket substantially face opposite end surfaces of the magnetic core in the axial direction.

An insulating spacer preferably is interposed between the inductance and the base plate of the bracket for preventing a short circuit between the inductance (coil) and the bracket.

A groove preferably is recessed on the base surface of the housing and is capable of housing the base plate of the bracket. The depth of the groove preferably exceeds a plate thickness of the base plate. Thus, the bracket can be mounted and positioned in the groove on the base surface of the housing to avoid unintended contact with elements in the housing and to avoid a short circuit.

The housing preferably is a connector housing formed to fit with a mating connector and terminal fittings in the housing may define the input and/or output terminals. Accordingly, the noise filter device can be applied to a connector shaped to include terminal fittings.

According to the above, a closed magnetic path is formed by the magnetic core, the gaps defined at opposite end sides of the inductance in the axial direction and the bracket. Thus, a situation is avoided where magnetic fluxes generated when a current flows in the inductance disperse to other areas. Further, magnetic flux saturation and the deterioration of noise filter characteristics associated therewith can be suppressed by the gaps defined between the inductance and the end plates. Furthermore, the bracket is housed in the housing in at least a partly exposed state. Therefore, a degree of freedom in wiring is improved and a layout design of the noise filter device is facilitated.

These and other features and advantages of the invention will become more apparent upon reading the following detailed description of preferred embodiments and accompanying drawings. It should be understood that even though embodiments are described separately, single features thereof may be combined to additional embodiments.

DETAILED DESCRIPTION OF THE PREFERRED EMBODIMENTS

Figure 3:
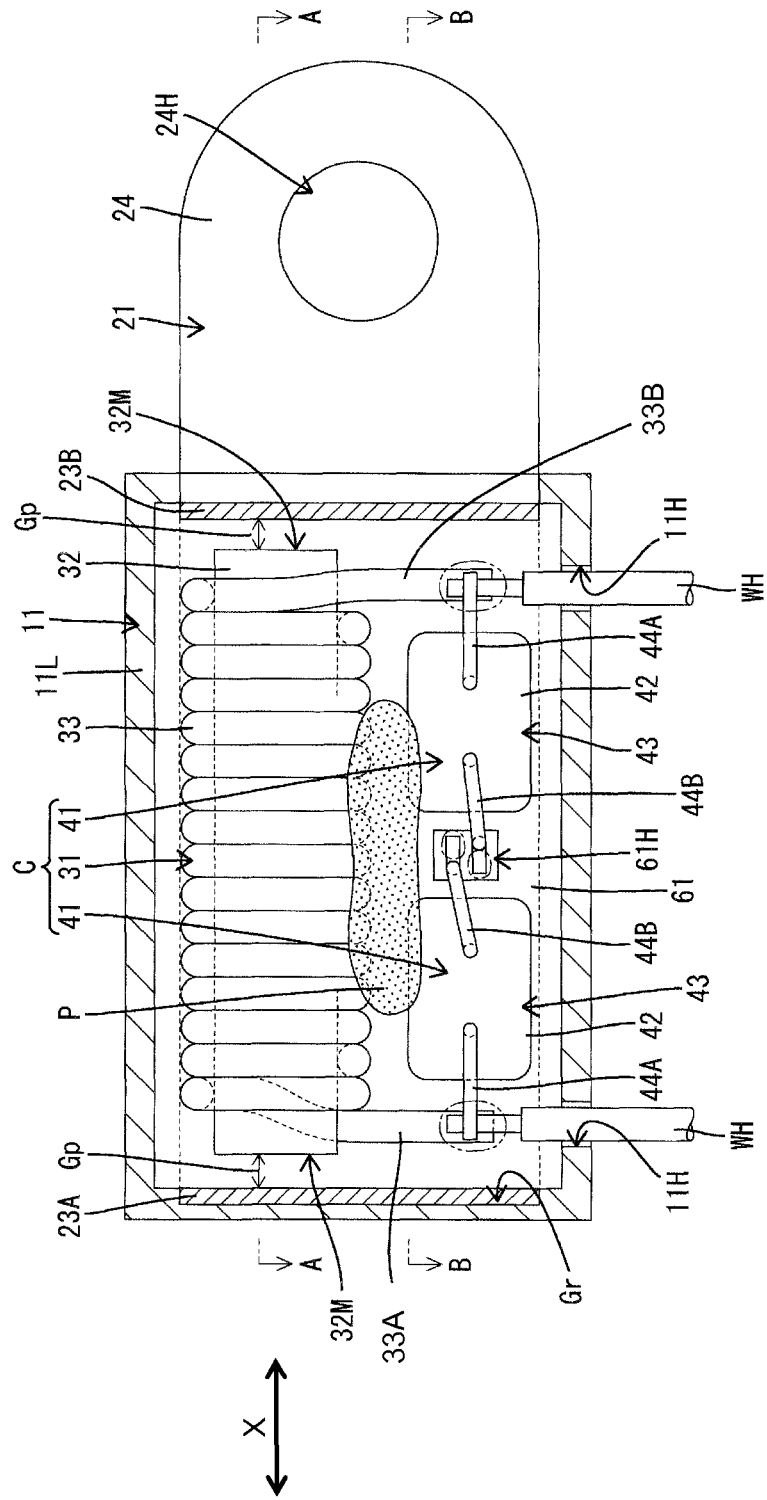
FIG. 3 is a plan view in section of a noise filter device of the first embodiment.

A noise filter device of a first embodiment includes a bracket 21, an inductance 31 (e.g. coil), a capacitance comprising two capacitors 41, two wires WH that function as input and output terminals, a spacer 61 and a housing 11 for housing the above-described. In the following description, lower and upper sides of FIG. 3 are referred to respectively as front and rear ends concerning a front-back direction.

Figure 2:
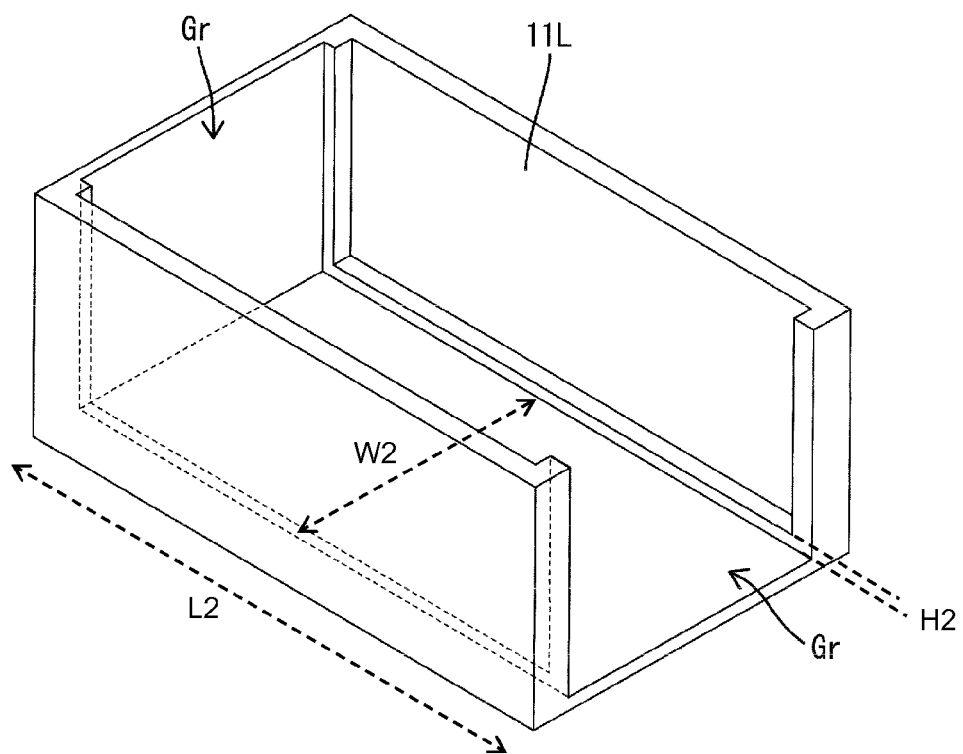
FIG. 2 is a perspective view of a housing of the first embodiment.

The housing 11 is made e.g. of synthetic resin and comprises a first or lower housing 11L and a second or upper housing 11U. The first housing 11L defines a substantially box shape with lateral openings. The second housing 11U is capable of at least partly closing the lateral openings as shown in FIG. 3. Two insertion holes 11H are formed in the front surface of the first housing 11L and the wires WH are respectively insertable therein. Further, a laterally extending groove Gr is recessed in a bottom surface of the first housing 11L, as shown in FIG. 2. Further, a vertically extending groove Gr is recessed in the right surface of the first housing 11L.

Figure 1:
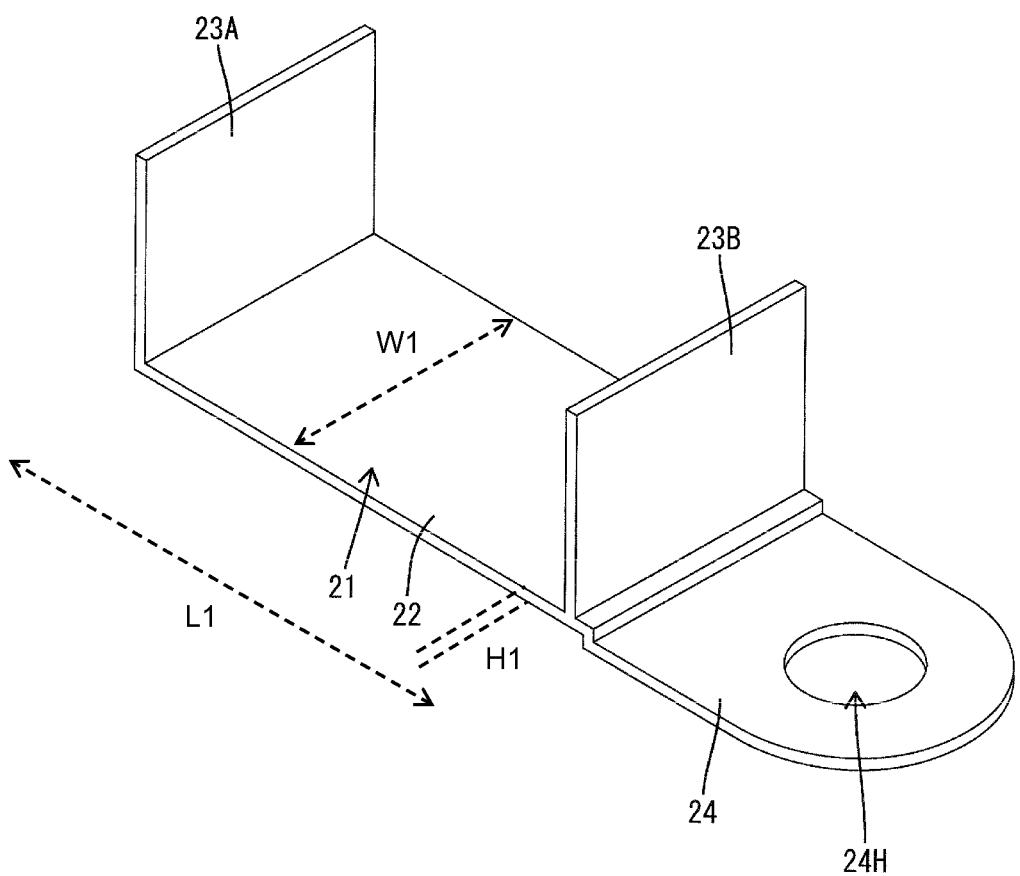
FIG. 1 is a perspective view of a bracket according to a first embodiment.

The bracket 21 is formed by punching, cutting or stamping a conductive plate that has magnetic and electrical conductive properties, such as iron alloy. A punched piece then is bent to define a substantially flat bottom plate 22, and first and second end plates 23A, 23B project from the bottom plate 22, as shown in FIG. 1. A width W1 of the bottom plate 22 is substantially equal to a width W2 of the groove Gr formed on the bottom surface of the lower housing 11L (W1=W2). Further, a length L1 between the end plates 23A, 23B is substantially equal to a length L2 of the lower housing 11L in an extending direction of the groove Gr (L1=L2). Further, a plate thickness H1 of the bottom plate 22 is less than a depth H2 of the grooves Gr of the lower housing 11L (H1<H2).

As shown in FIG. 1, one end of the bottom plate 22 is cranked or stepped to form a ground connection portion 24. A tip part of the ground connection portion 24 has a substantially semicircular shape. A substantially perfectly circular bolt hole 24H is open in a substantially center of the tip part of the ground connection portion 24 so that the ground connection portion 24 can be bolt-fastened to a ground point such as a vehicle body panel.

The coil 31 is formed by winding a conductive wire 33 around a substantially cylindrical magnetic core 32. Further, as shown in FIG. 3, opposite end parts 33A, 33B of the conductive wire 33 are pulled out at a specified height (pulled out forward in FIG. 3) in the substantially same direction. A length L3 of the magnetic core is slightly shorter than the length L2 of the lower housing 11L in the extending direction of the groove Gr (L3<L2).

The two capacitors 41 form part of a π-type noise filter circuit C together with the inductance coil 31, and the capacitors 41 having the same type and/or capacitance. The capacitors 41 specifically are both film capacitors and each has a block-shaped capacitor main body 42 and positive and negative electrode lead wires 44A, 44B are drawn out from a pull-out surface 43 of the capacitor main body 42. The film capacitor has no polarity. Thus, the positive and negative electrode lead wires 44A, 44B have substantially the same length.

The spacer 61 is a flat plate made e.g. of synthetic resin and can fit at least partly into the groove Gr in the lower housing 11L (FIG. 3). An opening 61H is provided substantially in the center of the spacer 61. A thickness H3 of the spacer 61 is set at a value obtained by subtracting the plate thickness H1 of the bottom plate 22 of the bracket 21 from the depth H2 of the groove Gr of the lower housing 11L (H3=H2−H1).

The noise filter device is assembled by fitting the bottom plate 22 of the bracket 21 into the groove Gr of the lower housing 11L. At this time, a cranked or stepped part of the bracket 21 is locked to an edge of the left opening of the lower housing 11L and the ground connection portion 24 protrudes to the outside of the lower housing 11L. Further, the first end plate 23A is fit and positioned in the groove Gr on the right surface of the lower housing 11L (FIG. 3). The spacer 61 then is arranged on the bottom plate 22 of the bracket 21 via an adhesion means to completely fill the groove Gr of the lower housing 11L. In this way, the bottom surface of the lower housing 11L becomes flat without having any step.

Figure 4:
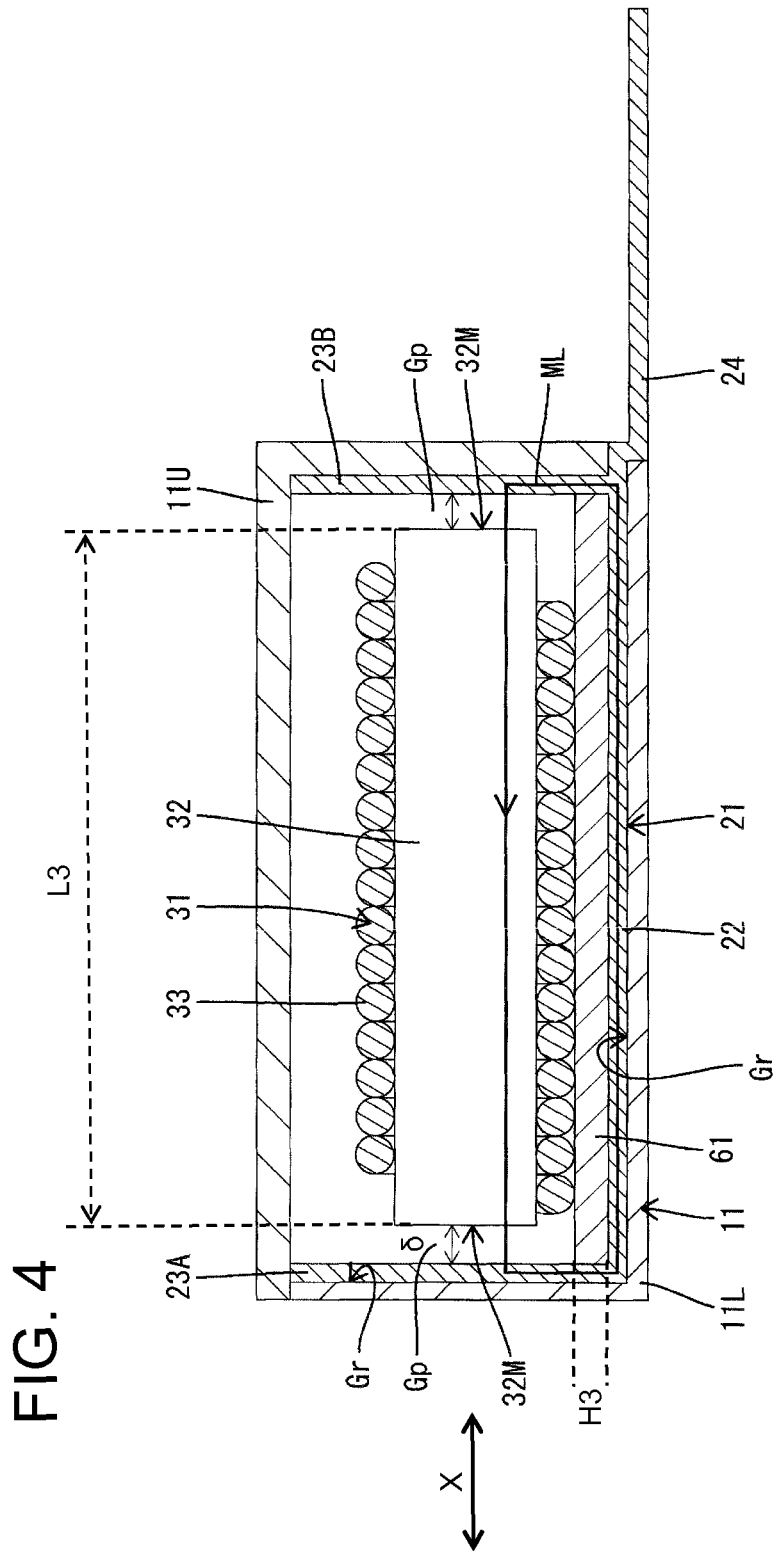
FIG. 4 is a side view in section along A-A of FIG. 3.

The coil 31 then is placed in a rear side of the lower housing 11L via an unillustrated adhesion means. At this time, the coil 31 is arranged so that the substantially opposite end parts 33A, 33B of the conductive wire 33 thereof are pulled forward (FIG. 3). Further, opposite end surfaces 32M of the magnetic core 32 in an axial or longitudinal direction X and the end plates 23A, 23B are spaced apart by the same distance. This causes specified gaps Gp to be defined between the magnetic core 32 and the end plates 23A, 23B (gap length δ=(L2−L3)/2) as shown in FIG. 4. In this way, a closed magnetic path ML comprising the magnetic core 32 of the coil 31, the gaps Gp and the end plates 23A, 23B and the bottom plate 22 of the bracket 21 is formed, as shown in FIG. 4.

The capacitors 41 then are placed at opposite sides of the opening 61H on the spacer 61, as shown in FIG. 3. At this time, the capacitors 41 are oriented so that the pull-out surfaces 43, from which the lead wires 44A, 44B of the capacitors 41 are pulled out, face up or towards the coil 31. Epoxy resin P then is poured in the lower housing 11L to bridge the coil 31, the spacer 61 and the capacitors 41 and to fix the coil 31 and the capacitors 41 completely (FIG. 3).

Figure 5:
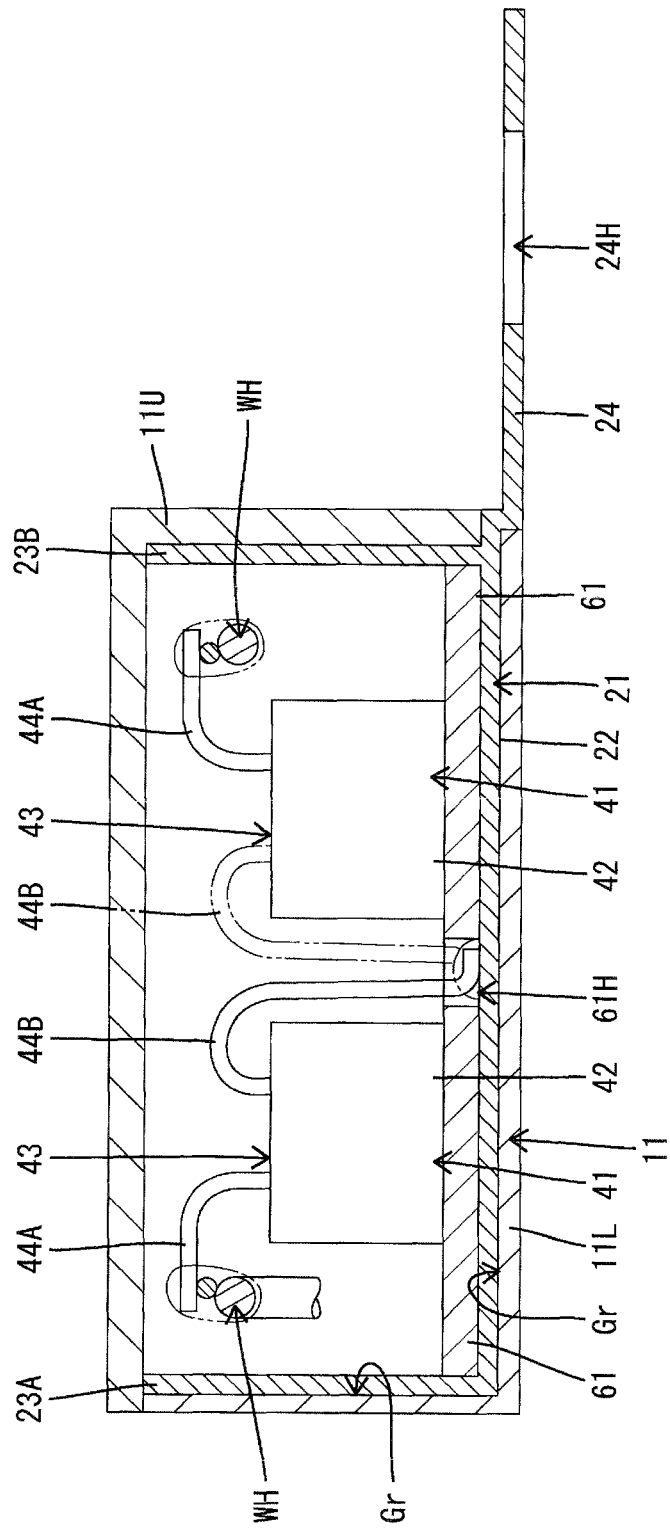
FIG. 5 is a side view in section along B-B of FIG. 3.

A wiring operation is performed to form the π-type filter circuit C after the the coil 31 and the capacitors 41 have been fixed in the lower housing 11L. First, the wires WH that serve as the input and output terminals are inserted through the insertion holes 11H on the front of the lower housing 11L. Then, as shown in FIG. 3, the positive electrode lead wires 44A of the respective capacitors 41 and conductive wires of the respective wires WH are connected to the opposite end parts 33A, 33B of the conductive wire 33 pulled out from the coil 31 by soldering while being held in contact. The negative electrode lead wires 44B of the respective capacitors 41 also are connected to the bottom plate 22 of the bracket 21 exposed through the opening 61H by soldering (FIG. 5) while being held in contact, as shown in FIGS. 3 and 5, to complete the connection of the π-type filter circuit C. Finally, the upper and left openings of the lower housing 11L are closed by the upper housing 11U. At this time, the second end plate 23B and the left end surface of the upper housing 11U are held completely in close contact with each other to complete the assembling of the noise filter device.

Next, functions and effects of this embodiment are described.

According to this embodiment, the closed magnetic path ML is formed by the magnetic core 32, the bottom plate 22 and the first and second end plates 23A, 23B of the bracket 21 and the gaps Gp defined between the opposite end surfaces 32M of the magnetic core 32 in the axial direction X and the respective end plates 23A, 23B. This causes magnetic fluxes generated when a current flows in the coil 31 to be concentrated on the closed magnetic path ML. Thus, the magnetic fluxes are not dispersed to other areas to deteriorate noise filter characteristics. Further, the gaps Gp between the opposite end surfaces 32M of the magnetic core 32 in the axial direction X and the first and second end plates 23A, 23B suppress magnetic flux saturation and the deterioration of the noise filter characteristics associated therewith.

Further, the bottom plate 22 of the bracket 21 is exposed in the housing 21 so that the negative lead wires 44B of the capacitors 41 can be grounded easily. This improved degree of freedom in wiring provides a degree of freedom in layout design of the noise filter device.

The spacer 51 is between the coil 31 and the bottom plate 22 of the bracket 21. Thus, the conductive wire 33 of the coil 31 and the bottom plate 22 will not short.

The groove Gr is recessed on the bottom surface of the lower housing 11L and can receive the bottom plate 22 of the bracket 21. The depth of the groove Gr exceeds the plate thickness of the bottom plate 22 so that the bottom plate 22 can be embedded in the groove Gr. This avoids unintended contact between the bottom plate 22 and the coil 31 or the capacitors 41 in the housing 11 for easily suppressing troubles such as a short circuit.

A second embodiment of the noise filter device of the invention is applied to a connector and includes a bracket 21, an inductance 31 comprising a coil 31, two capacitors 41, a spacer 61, a housing 71 and busbar terminal fittings 51A, 51B that function as input and/or output terminals. In the following description, lower and upper sides of FIG. 6 are referred to as front and rear ends concerning the front-back direction.

The housing 71 is composed of a lower housing 71L in the form of a box with upper, left and front openings and an upper housing 71U capable of at least partly closing the upper and left openings. The united housing 71 is partitioned into a receptacle 72 and a filter housing 73. The receptacle 72 is a rectangular tube that can fit to an unillustrated mating connector.

Figure 6:
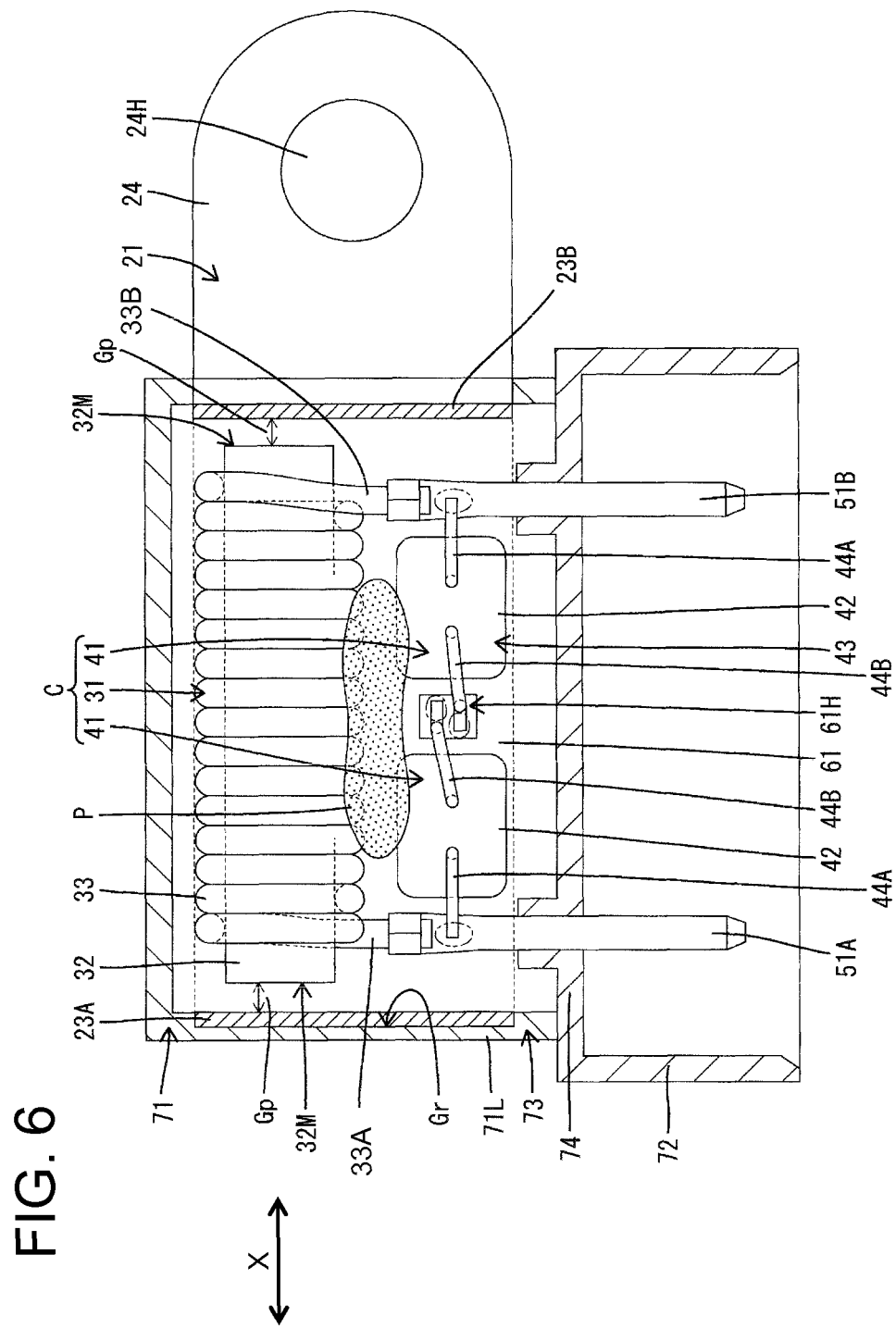
FIG. 6 is a plan view in section of a noise filter device according to a second embodiment.

As shown in FIG. 6, two tab-shaped busbar terminals 51A, 51B made of copper alloy are fixed by insert molding to a partition wall 74 between the receptacle 72 and the filter housing 73. Tip parts of the busbar terminals 51A, 51B project into the receptacle 72, and rear end parts connected to a π-type filter circuit C project into the filter housing 73.

The π-type filter circuit C similar to the one mounted in the lower housing 11L of the first embodiment is housed in the filter housing portion 73. As shown in FIG. 6, instead of the wires WH, the busbar terminals 51A, 51B are wired to the π-type filter circuit C. The other configuration is substantially same as or similar to the first embodiment and can exhibit similar functions and effects.

As described above, it is possible to obtain a noise filter device which has a simple device configuration and in which a wiring operation to the bracket 21 is facilitated.

The invention is not limited to the above described embodiments. For example, the following embodiments also are included in the scope of the invention.

Film capacitors are used in the above embodiments. However, electrolytic capacitors or ceramic capacitors may be used.

The capacitors have lead wires in the above embodiments. However, the capacitors may not include the lead wires.

The spacer need not be interposed between the coil and the housing.

The π-type filter circuit C is configured by one coil and two capacitors in the above embodiments. However, the numbers of the coils and the capacitors of the noise filter circuit can be different.

The tab-shaped busbar terminals are used as the terminal fittings in the second embodiment. However, other male or female terminal fittings may be used.

Although two terminal fittings are used in the above embodiments, three or more terminal fittings may be used.

The capacitors and the coil are connected by soldering in the above embodiments. However, they may be connected by laser welding, resistance welding or the like.

The gaps are air gaps in the above embodiments. However, an insulating material or the like may be between the end plates and the magnetic core.

The bottom plate of the bracket is exposed by the opening on the spacer in the above embodiments. However, the size and the position of the opening can vary.

What is claimed is:

1. A noise filter device, comprising:
    an inductance;
    a bracket including a base plate and two end plates projecting from the base plate, the end plates facing opposite end surfaces of the inductance in an axial direction with specified gaps between the end plates and the end surfaces of the inductance, the bracket formed of a magnetic material and grounded;
    at least one capacitor connected to the bracket and forming part of a noise filter circuit together with the inductance;
    a housing that houses the inductance, the at least one capacitor and the bracket in an at least partly exposed state; and
    input and output terminals connected to the noise filter circuit, wherein
    a groove is recessed on a base surface of the housing and at least partly houses the base plate of the bracket.

2. The noise filter device of claim 1, wherein the inductance comprises a coil formed by winding a conductive wire on a magnetic core.

3. The noise filter device of claim 2, wherein the end plates face opposite end surfaces of the magnetic core in the axial direction.

4. The noise filter device of claim 1, further comprising an insulating spacer interposed between the inductance and the base plate of the bracket.

5. The noise filter device of claim 1, wherein a depth of the groove exceeds a plate thickness of the base plate.

6. A noise filter device, comprising: an inductance;
    a bracket including a base plate and two end plates projecting from the base plate, the end plates facing opposite end surfaces of the inductance in an axial direction with specified gaps between the end plates and the end surfaces of the inductance, the bracket formed of a magnetic material and grounded;
    at least one capacitor connected to the bracket and forming part of a noise filter circuit together with the inductance;
    a connector housing including a filter housing that at least partly encloses the inductance, the at least one capacitor and the bracket and an open-ended tube projecting from a partition wall of the filter housing and formed to fit with a mating connector; and
    input and/or output terminals having inner ends connected to the noise filter circuit housed in the filter housing and outer ends projecting through the partition wall of the filter housing and into the open-ended tube projecting from the partition wall of the filter housing so that the outer ends of the input and/or output terminals are connectable to mating terminals in a mating connector.

7. The noise filter device of claim 6, wherein the input and/or output terminals are insert molded into the partition wall.

8. The noise filter device of claim 6, wherein the outer ends of the input and/or output terminals are tab-shaped busbar terminals.

* * * * *